(12) United States Patent
Groothuis et al.

(10) Patent No.: US 8,816,494 B2
(45) Date of Patent: Aug. 26, 2014

(54) SEMICONDUCTOR DEVICE PACKAGES INCLUDING THERMALLY INSULATING MATERIALS AND METHODS OF MAKING AND USING SUCH SEMICONDUCTOR PACKAGES

(75) Inventors: Steven Groothuis, Boise, ID (US); Jian Li, Boise, ID (US); Shijian Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/547,296

(22) Filed: Jul. 12, 2012

(65) Prior Publication Data
US 2014/0015598 A1 Jan. 16, 2014

(51) Int. Cl.
H01L 23/02 (2006.01)
H01L 23/22 (2006.01)
H01L 23/10 (2006.01)
H01L 23/34 (2006.01)
H01L 21/00 (2006.01)

(52) U.S. Cl.
USPC ............ 257/712; 257/E21.599; 257/E21.614; 257/686; 257/687; 257/706; 438/109; 438/113; 438/124

(58) Field of Classification Search
CPC ................. H01L 2924/00; H01L 2224/32225; H01L 2224/482227; H01L 2224/73265; H01L 2924/00014; H01L 2924/01079; H01L 2224/48091; H01L 2924/01078; H01L 2924/01029; H01L 23/4334
USPC ........... 257/E21.599, E21.614; 438/109, 113, 438/124
See application file for complete search history.

(56) References Cited

U.S. PATENT DOCUMENTS 5,563,086 A * 10/1996 Bertin et al. ............... 438/15
6,747,347 B2 6/2004 Farrar et al.
6,917,100 B2 7/2005 Chennupati
7,118,941 B2 * 10/2006 Zhang et al. ................ 438/122
7,119,428 B2 * 10/2006 Tanie et al. ................. 257/686
(Continued)

FOREIGN PATENT DOCUMENTS

KR 10-2011-0036150 A 4/2011
KR 10-2011-0037066 A 4/2011
KR 10-2012-0005185 A 1/2012

OTHER PUBLICATIONS

International Search Report, ISA/KR, International Application No. PCT/US2013/049730, Sep. 27, 2013, four (4) pages.
(Continued)

Primary Examiner — Shaun Campbell
Assistant Examiner — Thai T Vuong
(74) Attorney, Agent, or Firm — TraskBritt

(57) ABSTRACT

Semiconductor device packages comprise a first semiconductor device comprising a heat-generating region located on at least one end thereof. A second semiconductor device is attached to the first semiconductor device. At least a portion of the heat-generating region extends laterally beyond at least one corresponding end of the second semiconductor device. A thermally insulating material at least partially covers the end of the second semiconductor device. Methods of forming a semiconductor device packages comprise attaching a second semiconductor device to a first semiconductor device. The first semiconductor device comprises a heat-generating region at an end thereof. At least a portion of the heat-generating region extends laterally beyond an end of the second semiconductor device. The end of the second semiconductor device is at least partially covered with a thermally insulating material.

30 Claims, 4 Drawing Sheets

(56) References Cited

U.S. PATENT DOCUMENTS

| | | | | |
|---|---|---|---|---|
| 7,309,911 | B2* | 12/2007 | Bartley et al. | 257/675 |
| 7,589,417 | B2* | 9/2009 | Ramanathan et al. | 257/713 |
| 7,723,160 | B2* | 5/2010 | Houle et al. | 438/122 |
| 7,763,496 | B2* | 7/2010 | Ikeda et al. | 438/109 |
| 8,110,910 | B2* | 2/2012 | Kim | 257/686 |
| 8,193,625 | B2* | 6/2012 | Liu et al. | 257/686 |
| 2005/0051883 | A1* | 3/2005 | Fukazawa | 257/686 |
| 2005/0146854 | A1* | 7/2005 | Ikuta et al. | 361/719 |
| 2006/0091290 | A1 | 5/2006 | Yoshihara et al. | |
| 2007/0020814 | A1* | 1/2007 | Hembree et al. | 438/124 |
| 2007/0090517 | A1* | 4/2007 | Moon et al. | 257/706 |
| 2008/0042261 | A1 | 2/2008 | Wolter et al. | |
| 2008/0054433 | A1* | 3/2008 | Yoo et al. | 257/686 |
| 2009/0321959 | A1* | 12/2009 | Hedler et al. | 257/777 |
| 2010/0167467 | A1* | 7/2010 | Aoi | 438/109 |

OTHER PUBLICATIONS

Written Opinion of the International Searching Authority, ISA/KR, International Application No. PCT/US2013/049730, Sep. 27, 2013, five (5) pages.

* cited by examiner

US 8,816,494 B2

SEMICONDUCTOR DEVICE PACKAGES INCLUDING THERMALLY INSULATING MATERIALS AND METHODS OF MAKING AND USING SUCH SEMICONDUCTOR PACKAGES

FIELD

The disclosure relates generally to semiconductor device packages and methods of making and using semiconductor device packages. More specifically, disclosed embodiments relate to semiconductor device packages providing thermal management through selective positioning of thermally insulating materials.

BACKGROUND

When in use, some semiconductor devices generate significant quantities of heat. Thermal management techniques are employed to conduct heat away from such semiconductor devices and other components near such semiconductor devices. For example, U.S. Patent Application Pub. No. 2008/0054433, published Mar. 6, 2008, to Yoo et al. discloses a heat transfer blocking spacer interposed between semiconductor chips to prevent transfer of heat from one chip to another. U.S. Pat. No. 7,309,911, issued Dec. 18, 2007, to Bartley et al. discloses a heat sink associated with a stack of platters for cooling a plurality of memory devices. U.S. Pat. No. 6,917,100 discloses multiple stacks of circuit chips that are grouped in groups not active at the same time, and circuit chips belonging to the same group, which are arranged in different layers in adjacent stacks. U.S. Pat. No. 6,747,347, issued Jun. 8, 2004, to Farrar et al. discloses a chip stack hermetically sealed in an enclosure, which includes a pressurized, thermally conductive fluid for cooling the enclosed chip stack. When thermal management techniques used to conduct heat away from heat-generating semiconductor devices are inadequate, the resulting temperatures may degrade performance of such semiconductor devices, may degrade performance of other components near such semiconductor devices, may damage such semiconductor devices, may damage other components near such semiconductor devices, and may even injure a user near that semiconductor device.

Referring to FIG. 4A, a schematic view of a conventional semiconductor device package 100 illustrating flow of heat within the semiconductor device package 100 is shown. The semiconductor device package 100 includes at least one semiconductor device 102 having a heat-generating region 104 such as a region of high power density, for example, a logic die including a high-power SerDes (i.e., Serializer-Deserializer). Additional semiconductor devices 106, such as memory devices (e.g., DRAM devices) are stacked on the semiconductor device 102 having the heat-generating region 104. The semiconductor device 102 having the heat-generating region 104 and the additional semiconductor devices 106 are electrically connected to one another by conductive elements 108 (e.g., conductive bumps, pillars, columns, studs) and conductive vias 109 (e.g., through silicon vias (TSVs)). A thermally conductive overmold 110 covers the semiconductor device 102 having the heat-generating region 104 and the additional stacked semiconductor devices 106. When in use, heat flows from the heat-generating region 104 of the semiconductor device 102 out of the semiconductor device package 100, as indicated by the arrows in FIG. 4A. As heat flows from the heat-generating region 104 out of the semiconductor device package 100, even though heat-generating region 104 is laterally offset from the additional stacked semiconductor devices 106, such heat flows through the thermally conductive overmold 110 not only toward the exterior of semiconductor device package 100, but also to and through the additional stacked semiconductor devices 106. Heat also flows from the heat-generating region 104 through the conductive elements 108 and electrically insulating underfill material between the respective semiconductor devices 102 and 106 and surrounding the conductive elements 108.

Referring to FIG. 4B, an enlarged view of a portion of the semiconductor device package 100 proximate the heat-generating region 104 of the semiconductor device 102 is shown. As indicated by arrows in FIG. 4B, the heat flowing from the heat-generating region 104 of the semiconductor device 104 may flow through the additional semiconductor devices 106 at least in part because the additional semiconductor devices 106 are positioned near the heat-generating region 104 and in contact with thermally conductive overmold 110. In addition, the heat flowing from the heat-generating region 104 may flow through the conductive elements 108 between the semiconductor devices 106 and conductive vias 109 within the additional semiconductor devices 106—at least in part because such conductive elements 108 and conductive vias 109 are positioned near the heat-generating region 104 and because materials of such conductive elements 108 and conductive vias 109 that exhibit high electrical conductance generally also exhibit high thermal conductance. As noted above, the underfill material between each of semiconductor device 102 and semiconductor devices 106 may also act to conduct heat. Thus, heat from the heat-generating region 104 may have a tendency to flow toward and into the additional semiconductor devices 106, and a path of low or even least resistance for the heat to travel out of the semiconductor device package 100 may be through the additional semiconductor devices 106 and the conductive elements 108. As heat flows from heat-generation region 104 through the additional semiconductor devices 106, the temperature of the additional semiconductor devices 106, and particularly of the lowermost semiconductor device 106, may increase to levels sufficient to cause damage to or failure of the additional semiconductor devices 106.

BRIEF DESCRIPTION OF THE DRAWINGS

While the specification concludes with claims particularly pointing out and distinctly claiming what are regarded as embodiments of the invention, various features and advantages of disclosed embodiments may be more readily ascertained from the following description when read in conjunction with the accompanying drawings, in which:

DETAILED DESCRIPTION

The illustrations presented herein are not meant to be actual views of any particular semiconductor device package or component thereof, but are merely idealized representations employed to describe illustrative embodiments. Thus, the drawings are not necessarily to scale. Additionally, elements common between figures may retain the same or similar numerical designation.

Disclosed embodiments relate generally to semiconductor device packages that may manage heat through selective positioning of thermally insulating materials. More specifically, disclosed are semiconductor device packages that may include at least one thermally insulating material at least partially covering an end of a semiconductor device to resist heat flow from another semiconductor device.

As used herein, the terms "about" and "substantially," used in connection with a given parameter, each mean and include variances from the designated value referenced for that particular parameter within normal manufacturing tolerances, material variations, accuracy of measuring instrumentation, consistency of controls, etc., as the case may be.

Figure 1:
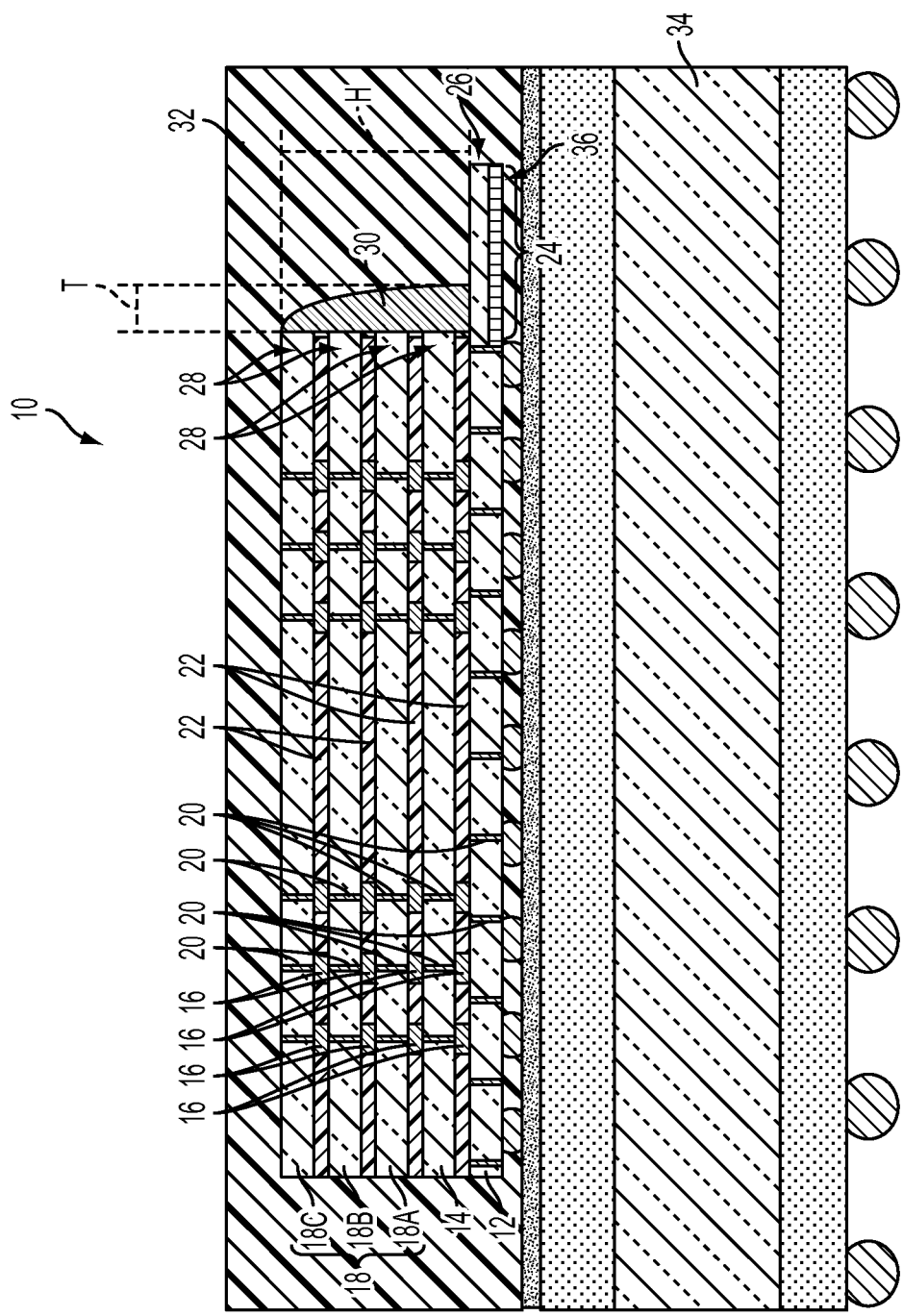
FIG. 1 is a schematic view of a semiconductor device package.

Referring to FIG. 1, a schematic view of a semiconductor device package 10 is shown. The semiconductor device package 10 may include a first semiconductor device 12 and a second semiconductor device 14 attached to the first semiconductor device 12. For example, the second semiconductor device 14 may be stacked on the first semiconductor device 12 and may be structurally secured and electrically connected to the first semiconductor device 12 by conductive elements 16 (e.g., conductive bumps or pillars). The semiconductor device package 10 may include at least one additional semiconductor device 18 attached to the second semiconductor device 14. For example, the semiconductor device package 10 may include any number of additional semiconductor devices 18A, 18B, and 18C, etc., sequentially stacked on the second semiconductor device 14 and on one another, such as, for example, a lowest additional semiconductor device 18A being structurally secured and electrically connected to the second semiconductor device 14 by conductive elements 16, an intermediate additional semiconductor device 18B being structurally secured and electrically connected to the lowest additional semiconductor device 18A by conductive elements 16, and a highest additional semiconductor device 18C being structurally secured and electrically connected to the intermediate additional semiconductor device 18B by conductive elements 16. As a specific, non-limiting example, the first semiconductor device 12 may comprise a logic semiconductor device (e.g., a logic chip) and the second semiconductor device 14 and additional semiconductor devices 18A, 18B, and 18C may comprise memory semiconductor devices (e.g., DRAMs) where the semiconductor device package 10 may be configured as a Memory Cube DRAM (MCDRAM) comprising a thermally conductive overmold over the highest additional semiconductor device 18C.

The first semiconductor device 12, the second semiconductor device 14, and additional semiconductor devices 18 may include conductive vias 20 or other electrical connections to enable electricity to flow between opposing sides of individual semiconductor devices 12, 14, and 18. Underfill 22, which may structurally support the conductive elements 16, adhere the semiconductor devices 12, 14, and 18 to one another, or both, may be interposed between adjacent semiconductor devices 12, 14, and 18. The first, second, and additional semiconductor devices 12, 14, and 18 may be electrically and structurally connected to a package substrate 34. Package substrate 34 may structurally support the first, second, and additional semiconductor devices 12, 14, and 18, may convey electronic signals from the package substrate 34 or from higher level packaging to which the package substrate 34 is electrically connected to the first, second, and additional semiconductor devices 12, 14, and 18, and may electrically connect the first, second, and additional semiconductor devices 12, 14, and 18 to an electrical power source.

The first semiconductor device 12 may comprise at least one heat-generating region 24 located on at least one end 26 of the first semiconductor device 12, heat from which may increase temperatures within the semiconductor device package 10. The heat-generating region 24 may comprise, for example, a high power density region of logic circuitry (e.g., high-speed logic circuitry, such as high-power SerDes), which may generate significant quantities of heat when in use. The end 26 of the first semiconductor device 12 may extend laterally beyond corresponding ends 28 of the second semiconductor device 14 and additional semiconductor devices 18. As a specific, non-limiting example, the end 26 of the first semiconductor device 12 may comprise a logic porch (e.g., a logic shelf). In some embodiments, one end 26 of a rectangular first semiconductor device 12 may extend laterally beyond the ends 28 of rectangular second semiconductor device 14 and additional semiconductor devices 18 proximate the end 26 of the first semiconductor device 12. In other embodiments, two opposing ends of the first semiconductor device 12 may extend laterally beyond corresponding ends of the second semiconductor device 14 and additional semiconductor devices 18, three ends (e.g., in a "U" shape) of the first semiconductor device 12 may extend laterally beyond corresponding ends of the second semiconductor device 14 and additional semiconductor devices 18, or all four ends (e.g., a periphery) of a rectangular first semiconductor device 12 may extend laterally beyond corresponding peripheries of the second semiconductor device 14 and additional semiconductor devices 18. At least substantially an entire area of the heat-generating region 24 may be located outside a footprint of the second semiconductor device 14 and additional semiconductor devices 18 in some embodiments. For example, a lateral offset, such as a lateral gap, (e.g., about 0.1 mm, about 10 μm, or less) may be defined between the ends 28 of the second semiconductor device 14 and additional semiconductor devices 18 and the heat-generating region 24. In other embodiments, a portion of the heat-generating region 24 may be located underneath a footprint of the second semiconductor device 14 and additional semiconductor devices 18. The ends 28 of the second semiconductor device 14 and additional semiconductor devices 18 may be at least substantially flush (e.g., vertically aligned or coplanar) with one another. For example, a lateral offset distance between outermost surfaces of the ends 28 of the second semiconductor device 14 and additional semiconductor devices 18 may be about 0.1 mm, about 0.01 mm, or less. In some embodiments, the second semiconductor device 14, the additional semiconductor devices 18, or both may also comprise heat-generating regions (not shown), heat from which may further increase temperatures within the semiconductor device package 10.

A thermally insulating material 30 may at least partially cover the end 28 of the second semiconductor device 14. For example, the thermally insulating material 30 may entirely cover the end 28 of the second semiconductor device 14 and may extend to at least partially cover some or all ends 28 of the additional semiconductor devices 18. In embodiments where heat-generating regions 24 are located on more than one end (e.g., opposing ends, three ends, around an entire periphery) of the first semiconductor device 12, thermally insulating material 30 may at least partially cover one corresponding end, some corresponding ends, or all corresponding ends of the second semiconductor device 14, of the additional semiconductor devices 18, or both. A height H of the thermally insulating material 30 above semiconductor device 12 may be about 0.05 mm or greater. For example, the height H of the thermally insulating material 30 may be about 0.09 mm, about 0.135 mm, about 0.18 mm, or greater. A thickness T of the thermally insulating material 30, perpendicular to the sides of the second semiconductor device 14 and additional semiconductor devices 18, at its thickest portion may be between about 0.1 mm and about 0.5 mm. For example, the thickness T of the thermally insulating material 30 may be between about 0.2 mm and about 0.3 mm at its thickest portion. In some embodiments, the thickness T of the thermally insulating material 30 may not be constant. The thickest portion of the thermally insulating material 30 may be located proximate (e.g., disposed on or adhered to) a laterally extending end 26 of the first semiconductor device 12 projecting beyond the second semiconductor device 14 and additional semiconductor devices 18 in such embodiments. In other embodiments, the thickness T of the thermally insulating material 30 may be at least substantially constant (e.g., as constant as known manufacturing techniques provide within a selected set or within a standard set of tolerances).

The thermally insulating material 30 may resist flow of heat from the heat-generating region 24 of the first semiconductor device 12 toward the second semiconductor device 14 and additional semiconductor devices 18. For example, the thermally insulating material 30 may increase thermal resistance along undesired flow paths (e.g., paths leading from the heat-generating region 24 of the first semiconductor device into the second semiconductor device 14 and the additional semiconductor devices 18), which may reduce the operating temperature of the second semiconductor device 14 and the additional semiconductor devices 18. The thermally insulating material 30 may cause the thermal resistance along desired flow paths (e.g., paths leading from the heat-generating region 24 out of the semiconductor device package 10 without passing through the second semiconductor device 14 or the additional semiconductor devices 18) to be, for example, comparatively decreased, which may maintain the temperatures within the semiconductor device package 10 below maximum recommended operating temperatures, below temperatures that would damage components of the semiconductor device package 10, or below temperatures that would cause one or more components of the semiconductor device package 10 to experience catastrophic failure. For example, the thermally insulating material 30 may exhibit a thermal conductivity that is less than a thermal conductivity of other materials in a flow path away from the second semiconductor device 14 and additional semiconductor devices 18. For example, a thermally conductive overmold 32 may cover the first, second, and additional semiconductor devices 12, 14, and 18 and the thermally insulating material 30, and heat flowing through the thermally conductive overmold 32 may be directed away from the second semiconductor device 14 and additional semiconductor devices 18 and out of the semiconductor device package 10.

A temperature of the second semiconductor device 14 and additional semiconductor devices 18 may be maintained below temperatures that would damage the second semiconductor device 14 and additional semiconductor devices 18 when the semiconductor device package 10 is in use, at least in part, because of the resistance of the thermally insulating material 30 to heat flowing into the second semiconductor device 14 and additional semiconductor devices 18. For example, a maximum temperature of the second semiconductor device 14 and additional semiconductor devices 18 may be maintained at about 95° C. or less, which may be a maximum operational temperature to which a memory semiconductor device (e.g., DRAM) may be heated without being thermally damaged. As specific, non-limiting examples, maximum operational temperatures of the second semiconductor device 14 and additional semiconductor devices 18 may be maintained at about 94° C., about 93° C., about 92° C., or less. A temperature of the first semiconductor device 12 may also be maintained below temperatures that would damage the first semiconductor device 12. A maximum operational temperature to which the first semiconductor device 12 may be heated without being thermally damaged may be greater than a maximum operational temperature to which the second semiconductor device 14 and additional semiconductor devices 18 may be heated without being thermally damaged. For example, a maximum operational temperature of the first semiconductor device 12 may be maintained at about 105° C. or less, which may be a maximum operational temperature to which a logic semiconductor device (e.g., a logic chip) may be heated without being thermally damaged. As specific, non-limiting examples, maximum operational temperatures of the first semiconductor device 12 may be maintained at about 101° C., about 100° C., about 99° C., or less.

A thermal conductivity of the thermally insulating material 30 may be about 0.5 W/m·K or less. For example, the thermal conductivity of the thermally insulating material 30 may be about 0.2 W/m·K. A thermal conductivity of the thermally conductive overmold 32 may be about 3.0 W/m·K or more. For example, the thermal conductivity of the thermally conductive overmold 32 may be about 5.0 W/m·K. The thermal conductivity of the thermally conductive overmold 32 may be between about 6 times to about 25 times greater than the thermal conductivity of the thermally insulating material 30. Suitable thermally conductive overmold 32 materials are commercially available, for example, from Sumitomo Plastics America, Inc. of Santa Clara, Calif. A thermal conductivity of the underfill 22 may be between about 0.5 W/m·K and about 2.0 W/m·K.

In some embodiments, a thermal spreader (not shown), such as, for example, a copper foil, may be disposed on the highest additional semiconductor device 18C before or after forming the overmold 32. In some embodiments, a heat sink (not shown) may be secured to the thermal spreader, to an upper surface of the overmold 32, or to one or more of the first, second, and additional semiconductor devices 12, 14, and 18.

The thermally insulating material 30 may comprise a thermally insulating polymer in some embodiments. For example, the thermally insulating material 30 may comprise a polymer underfill material or a polymer including non-conductive filler material. As a specific, non-limiting example, the thermally insulating material 30 may comprise HYSOL® FF6000, a commercially available underfill material offered by Henkel Electronic Materials LLC of Irvine, Calif.

The semiconductor device package 10 may be formed by at least partially covering the end 28 of the second semiconductor device 14 with the thermally insulating material 30. In embodiments where the thermally insulating material 30 comprises a thermally insulating polymer underfill material, the thermally insulating material 30 may be dispensed over the at least a portion of the end 28 of the second semiconductor device 14 using commercially available underfill dispensers, such as, for example, those available from Nordson ASYMTEK of Carlsbad, Calif. A dispenser (e.g., a nozzle or needle) of such an underfill dispenser may pass over at least a portion of the end 28 of the second semiconductor device 14 while fluid thermally insulating material 30 flows out of the dispenser onto the end 28 of the second semiconductor device 14. The thermally insulating material 30 may be wettable to the material of the second semiconductor device 14, and to the material of additional semiconductor devices 18, to enable the thermally insulating material 30 to remain in contact with the second semiconductor device 14 and, optionally, with the additional semiconductor devices 18 before, during, and after any processes occurring after the thermally insulating material 30 is dispensed onto the end 28 of the second semiconductor device 14. In addition, the thermally insulating material 30 may be of sufficiently high viscosity to enable the thermally insulating material 30 to remain in contact with the second semiconductor device 14 before and during any curing of the thermally insulating material 30 that may fix the position of the thermally insulating material 30. The thermally insulating material 30 may be dispensed in a single pass, provided that sufficient thickness T and height H of the thermally insulating material 30 is achieved during that pass. Otherwise, the thermally insulating material 30 may be dispensed in multiple passes, which may build up sequential portions of the thermally insulating material 30 until a preselected thickness T and height H are reached. As discussed previously, the thermally insulating material 30 may be dispensed to completely cover the end 28 of the second semiconductor device 14 and to partially or completely cover ends 28 of additional semiconductor devices 18 stacked on the second semiconductor device 14.

In some embodiments, the semiconductor device package 10 may be oriented horizontally (i.e., with a major surface 36, for example an active surface, of the first semiconductor device 12 oriented perpendicular to a line extending radially vertically from the earth's surface) while the thermally insulating material 30 is dispensed. In other embodiments, the semiconductor device package 10 may be oriented vertically (i.e., with the active surface 36 of the first semiconductor device 12 perpendicular to a line extending horizontally tangent to the earth's surface) while the thermally insulating material 30 is dispensed. In still other embodiments, the semiconductor device package 10 may be oriented at an angle, such as, for example, to form a trough with the end 26 of the first semiconductor device 12 and the ends 28 of the second semiconductor device 14 and additional semiconductor devices 18, while the thermally insulating material 30 is dispensed. The dispenser may approach the ends 28 of the second semiconductor device 14 and additional semiconductor devices 18 pointing at any angle, such as, for example, vertically downward, horizontally, or an angle between horizontal and vertical while the thermally insulating material 30 is dispensed.

After dispensing the thermally insulating material 30, the thermally insulating material 30 may be cured to fix the thermally insulating material 30 in place. During or after dispensing, and in particular after curing, of the thermally insulating material 30, the thermally conductive overmold 32 may be formed to cover the first, second, and any additional semiconductor devices 12, 14, and 18 and the thermally insulating material 30 in some embodiments.

In other embodiments, the thermally insulating material 30 may be molded into its desired shape, cured, and subsequently attached to at least partially cover the ends 28 of the first semiconductor device 14 and, optionally, of the additional semiconductor devices 18. For example, the thermally insulating material 30 may be adhered to the ends 28 of the first semiconductor device 14 and the additional semiconductor devices 18.

EXAMPLE

Figure 2A:
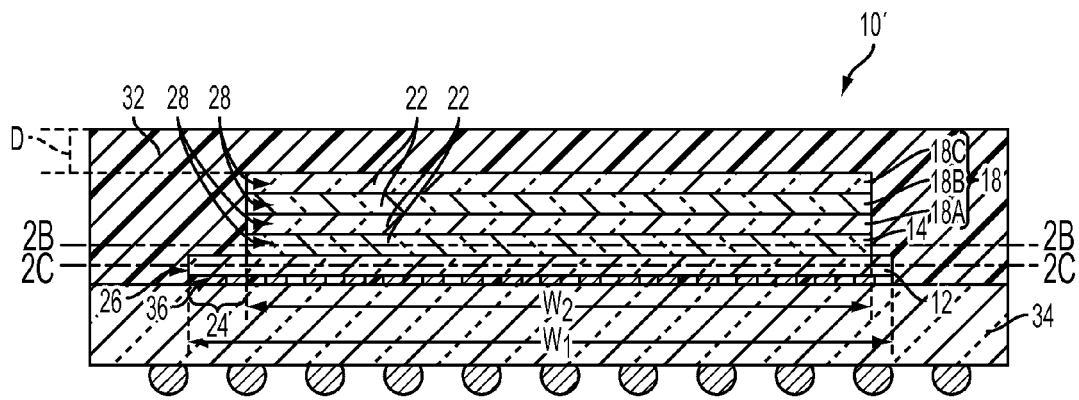
FIG. 2A is a schematic view of another semiconductor device package.

Referring to FIG. 2A, a schematic view of another semiconductor device package 10' is shown. The components and configuration of the semiconductor device package 10' are similar to those of the semiconductor device package 10 of FIG. 1, with the exception that the semiconductor device package 10' of FIG. 2A lacks the thermally insulating material 30 (see FIG. 1). Distribution of heat when the semiconductor device package 10' is in use was mathematically simulated and displayed as a heat map, using ANSYS Mechanical, which is Computer Aided Engineering (CAE) software for performing thermal analysis commercially available from ANSYS, Inc. of Canonsburg, Pa. As specific examples of the parameters used in the simulation, a lateral width $W_1$ of the first semiconductor device 12 was simulated as 12 mm and a lateral width $W_2$ of the second semiconductor device 14 and additional semiconductor devices 18 was simulated as 11 mm. Each of the first, second, and additional semiconductor devices 12, 14, and 18 was simulated as being 0.05 mm thick with 0.03 mm of underfill 22 therebetween. The first, second, and additional semiconductor devices 12, 14, and 18 were simulated as having a thermal conductivity of 148 W/m·K at 20° C. and 105 W/m·K at 100° C. A polymeric underfill 22 was simulated as having a thermal conductivity of 0.4 W/m·K, while passivation material (not shown) on semiconductor dice 12, 14, and 18 was simulated as having a theRmal conductivity of 0.2 W/m·K. The thermally conductive overmold 32 was simulated as having a thermal conductivity of 3.0 W/m·K. A distance D between an upper surface of the highest additional semiconductor device 18C and an upper surface of the thermally conductive overmold 32 was simulated as 0.2 mm. The conductive elements 16 (see FIG. 1) were simulated as copper, having a thermal conductivity of 398 W/m·K in conjunction with a solder tip having a thermal conductivity of 50 W/m·K and material within the conductive vias 20 (see FIG. 1) was simulated as copper, having a thermal conductivity of 398 W/m·K.

Figure 2B:
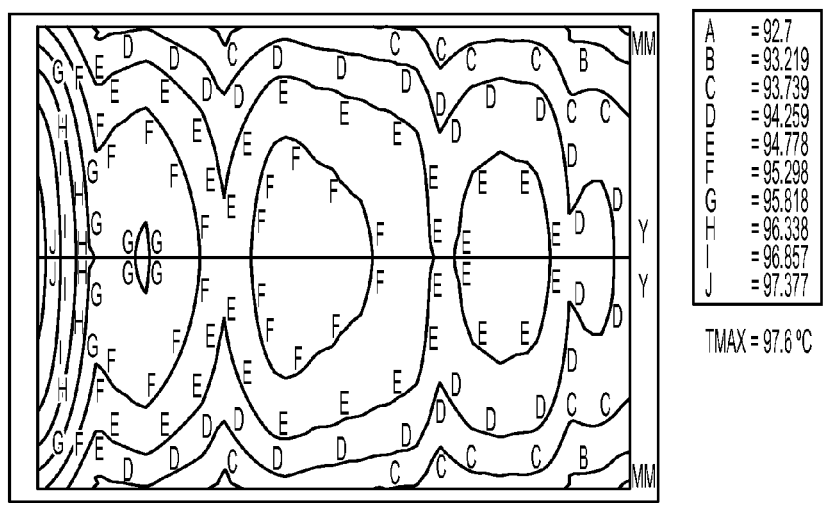
FIG. 2B is a cross-sectional view of a simulated heat map for a semiconductor device of the semiconductor device package of FIG. 2A.

Referring to FIG. 2B, a cross-sectional view of a mathematically simulated heat map for the second semiconductor device 14 of the semiconductor device package 10 of FIG. 2A taken along dashed section line 2B-2B is shown. The regions of different average temperatures are designated by the dividing lines with their corresponding letter designations A through J, and the key shows average temperature in degrees Celsius for a given region A through J. As simulated, average operating temperatures in the regions A through J varied from 92.7° C. to 97.377° C., with higher temperatures in those regions G through J located proximate the heat-generating region 24 of the first semiconductor device 12. Maximum simulated temperature of the second semiconductor device 14 was 97.6° C. Thus, the maximum simulated operating temperature exceeded a maximum operating temperature to which the second semiconductor device 14 could be heated without experiencing thermal damage (e.g., above about 95° C.).

Figure 2C:
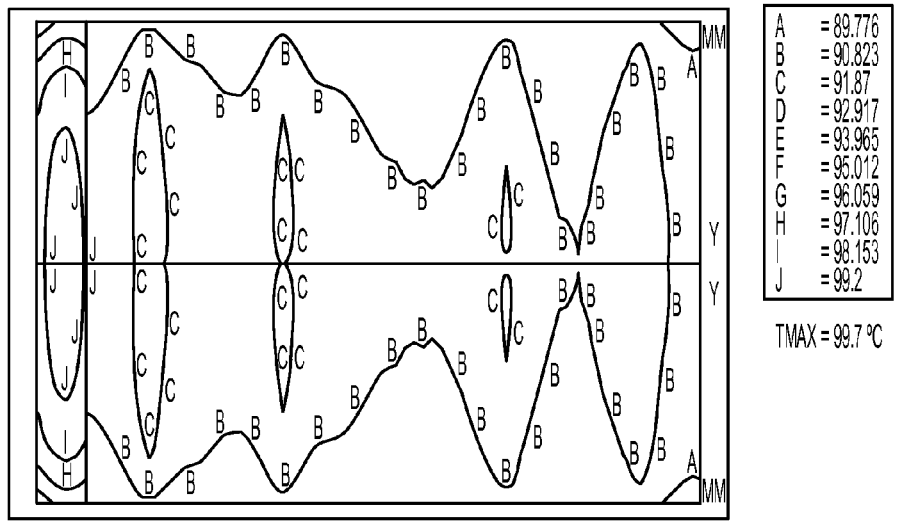
FIG. 2C is a cross-sectional view of a simulated heat map for another semiconductor device of the semiconductor device package of FIG. 2A.

Referring to FIG. 2C, a cross-sectional view of a mathematically simulated heat map for the first semiconductor device 12 of the semiconductor device package 10 of FIG. 2A taken along dashed section line 2C-2C is shown. As simulated, average temperatures in the regions A through J varied from 89.776° C. to 99.2° C., with higher temperatures in those regions G through J located proximate the heat-generating region 24 of the first semiconductor device 12. Maximum simulated temperature of the first semiconductor device 12 was 99.7° C. The maximum simulated operating temperature was maintained below a maximum operating temperature to which the first semiconductor device 12 could be heated without experiencing thermal damage (e.g., below about 105° C.). However, this temperature resulted in part from damaging heat being transferred to second semiconductor device 14.

Figure 3A:
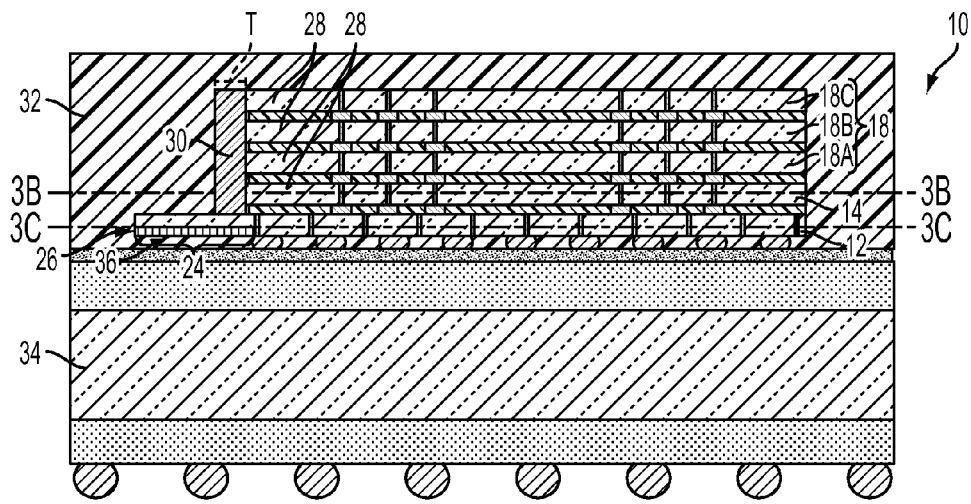
FIG. 3A is a schematic view of the semiconductor device package of FIG. 1.

Referring to FIG. 3A, a schematic view of the semiconductor device package 10 of FIG. 1 is shown. The configuration and parameters for simulation are identical to those used for the simulated semiconductor device package 10' of FIG. 2A, with the exception that the semiconductor device package 10 includes a thermally insulating material 30 covering the ends 28 of the second semiconductor device 14 and additional semiconductor devices 18. The thickness T of the thermally insulating material 30 was simulated as being a constant 0.3 mm, and the thermal conductivity of the thermally insulating material was simulated as being 0.2 W/m·K.

Figure 3B:
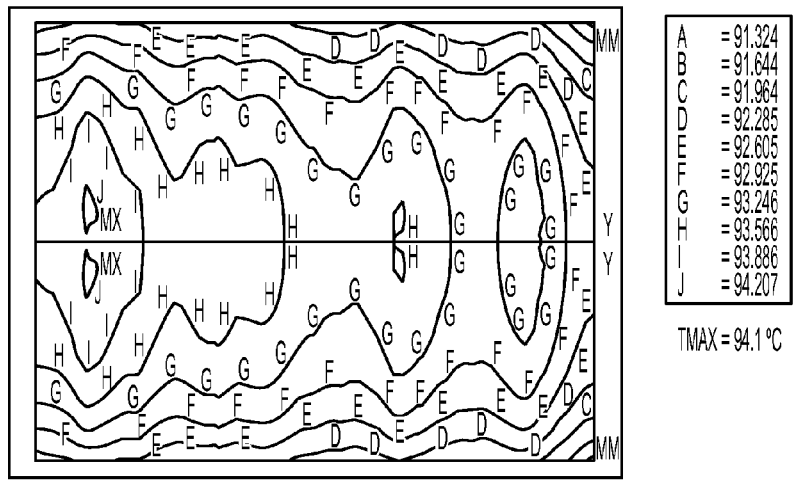
FIG. 3B is a cross-sectional view of a simulated heat map for a semiconductor device of the semiconductor device package of FIG. 3A.

Referring to FIG. 3B, a cross-sectional view of a simulated heat map for a semiconductor device of the semiconductor device package of FIG. 3A taken along dashed section line 3B-3B is shown. As simulated, average temperatures in the regions A through J varied from 91.324° C. to 94.207° C., with higher temperatures in those regions H through J located proximate the heat-generating region 24 of the first semiconductor device 12. Maximum simulated operational temperature of the second semiconductor device 14 was 94.1° C., below a maximum operational temperature to which the second semiconductor device 14 could be heated without experiencing thermal damage (e.g., below about 95° C.).

Figure 3C:
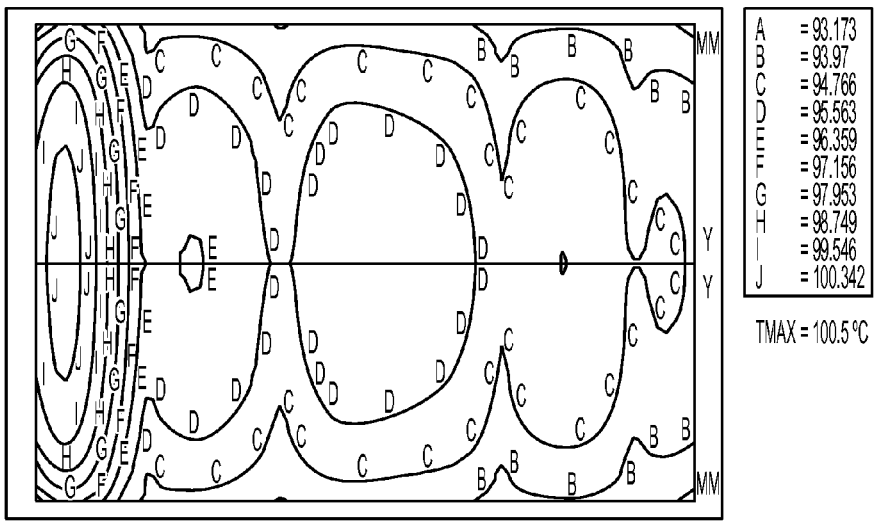
FIG. 3C is a cross-sectional view of a simulated heat map for another semiconductor device of the semiconductor device package of FIG. 3A.
Figure 4A:
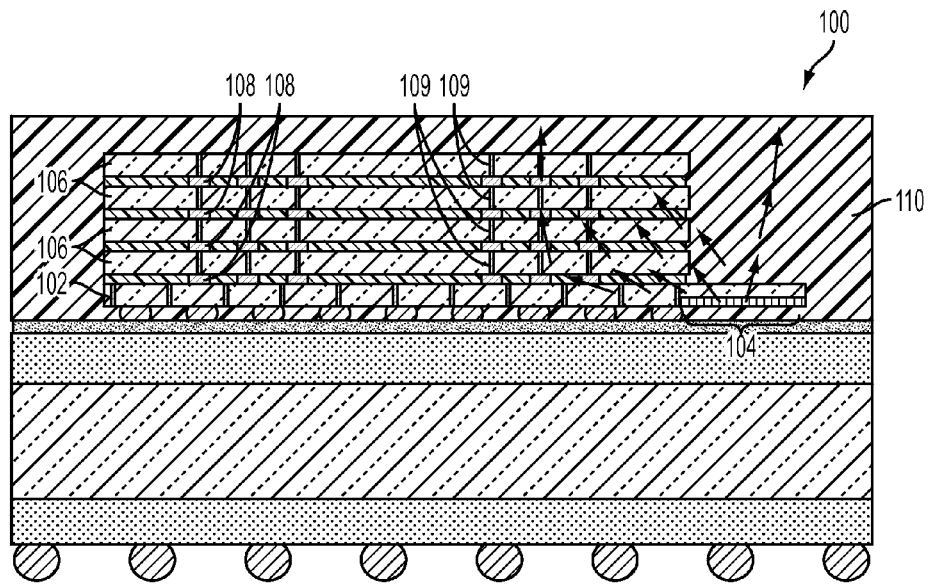
FIG. 4A is a schematic view of a conventional semiconductor device package illustrating flow of heat within the semiconductor device package.
Figure 4B:
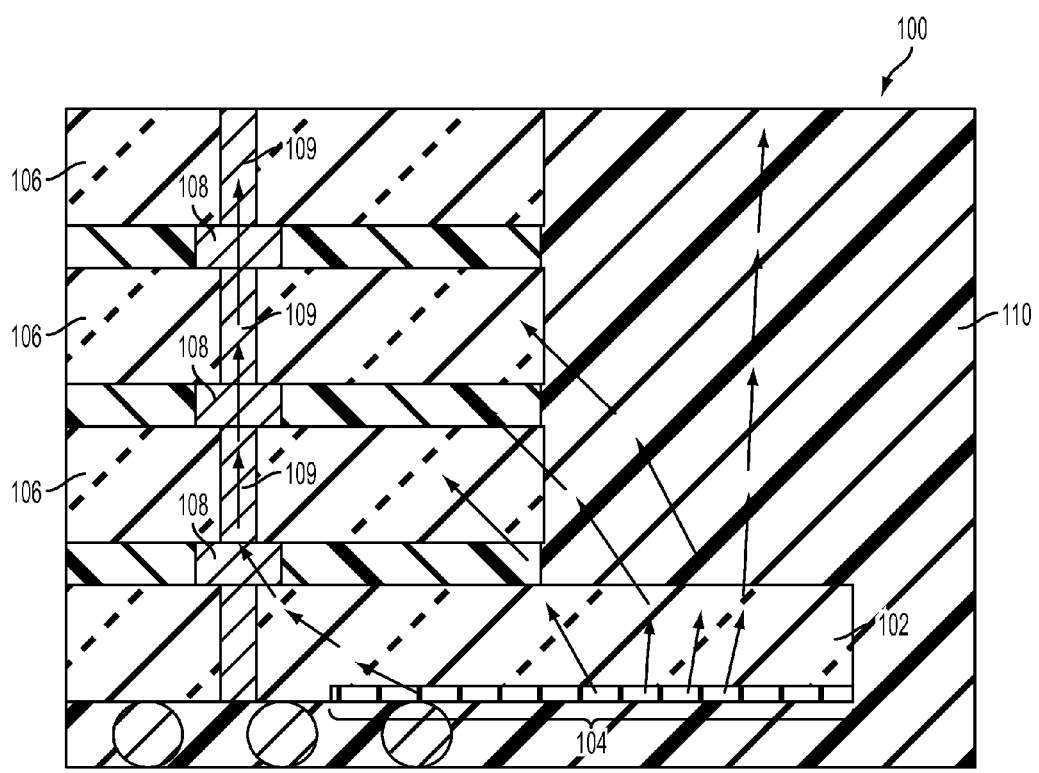
FIG. 4B is an enlarged view of a portion of the semiconductor device package of FIG. 4A.

Referring to FIG. 3C, a cross-sectional view of a simulated heat map for another semiconductor device of the semiconductor device package of FIG. 3A taken along dashed section line 3C-3C is shown. As simulated, average temperatures in the regions A through J varied from 93.173° C. to 100.342° C., with higher temperatures in those regions F through J located proximate the heat-generating region 24 of the first semiconductor device 12. Maximum simulated operational temperature of the first semiconductor device 12 was 100.5° C. Although the maximum operational temperature increased relative to the maximum operational temperature of the first semiconductor device 12 of FIG. 2C, the maximum simulated operational temperature was still maintained well below a maximum operational temperature to which the first semiconductor device 12 could be heated without experiencing thermal damage (e.g., below about 105° C.).

Comparing the results of the simulations, the maximum operational temperature of the second semiconductor device 14 was reduced by 3.7% by covering the ends 28 of the second semiconductor device 14 and additional semiconductor devices 18. By contrast, the maximum operational temperature of the first semiconductor device 12 was increased by only 0.8%. Accordingly, the thermally insulating material 30 may protect the second semiconductor device 14 and additional semiconductor devices 18 from damage caused by overheating due to flow of heat from the heat-generating region 24 of the first semiconductor device 12 by significantly decreasing the maximum operational temperature to which the second semiconductor device 14 (and additional semiconductor devices 18) is heated by the first semiconductor device 12. While doing so, the thermally insulating material 30 may only marginally increase the maximum operational temperatures to which the first semiconductor device 12 is heated.

While certain illustrative embodiments have been described in connection with the figures, those of ordinary skill in the art will recognize and appreciate that embodiments of the disclosure are not limited to those embodiments explicitly shown and described herein. Rather, many additions, deletions, and modifications to the embodiments described herein may be made without departing from the scope of the disclosure, including legal equivalents of the claims recited below. In addition, features from one disclosed embodiment may be combined with features of another disclosed embodiment while still being encompassed within the scope of embodiments of the disclosure as contemplated by the inventor.

What is claimed is:

1. A semiconductor device package, comprising:
a first semiconductor device comprising a heat-generating region located on an end thereof;
a second semiconductor device attached to the first semiconductor device, at least a portion of the heat-generating region extending laterally beyond an end of the second semiconductor device; and
a thermally insulating material at least partially covering the end of the second semiconductor device;
wherein a thermal conductivity of the thermally insulating material is less than a thermal conductivity of a material adjacent to a portion of the heat-generating region of the first semiconductor device to which the thermally insulating material is not adjacent.

2. The semiconductor device package of claim 1, wherein a the thermal conductivity of the thermally insulating material is about 0.5 W/m·K or less.

3. The semiconductor device package of claim 1, wherein the thermally insulating material comprises a thermally insulating polymer.

4. The semiconductor device package of claim 1, wherein the thermally insulating material comprises a thermally insulating polymer including non-conductive filler material.

5. The semiconductor device package of claim 1, further comprising an additional semiconductor device attached to the second semiconductor device on a side opposing a side to which the first semiconductor device is attached, wherein the thermally insulating material at least partially covers an end of the additional semiconductor device.

6. The semiconductor device package of claim 5, further comprising another additional semiconductor device attached to the additional semiconductor device on a side opposing a side to which the second semiconductor device is attached, wherein the thermally insulating material at least partially covers an end of the another additional semiconductor device.

7. The semiconductor device package of claim 1, further comprising a thermally conductive overmold at least partially covering the first and second semiconductor devices and the thermally insulating material.

8. The semiconductor device package of claim 7, wherein a thermal conductivity of the thermally conductive overmold is about 3.0 W/ m·K or more.

9. The semiconductor device package of claim 1, wherein a thickness of the thermally insulating material is between about 0.1 mm and about 0.5 mm.

10. The semiconductor device package of claim 9, wherein the thickness of the thermally insulating material is about 0.3 mm.

11. The semiconductor device package of claim 1, wherein a height of the thermally insulating material is about 0.05 mm or more.

12. The semiconductor device package of claim 11, wherein the height of the thermally insulating material is about 80 μm.

13. The semiconductor device package of claim 1, wherein the heat generating region located on the end of the first semiconductor device comprises heat generating regions on a plurality of ends of the first semiconductor device.

14. A semiconductor device package, comprising:
a logic semiconductor device comprising a heat-generating logic porch at an end thereof;
a memory semiconductor device attached to the logic semiconductor device, at least a portion of the heat-generating logic porch extending laterally beyond an end of the memory semiconductor device; and
a thermally insulating material at least partially covering the end of the memory semiconductor device,
wherein a thermal conductivity of the thermally insulating material is less than a thermal conductivity of a material adjacent to a portion of the heat-generating logic porch of the logic semiconductor device not in contact with the thermally insulating material.

15. The semiconductor device package of claim 14, wherein the thermal conductivity of the thermally insulating material is about 0.5 W/m·K or less.

16. The semiconductor device package of claim 14, further comprising an additional memory semiconductor device attached to the memory semiconductor device on a side opposing a side to which the logic semiconductor device is attached, wherein the thermally insulating material at least partially covers an end of the additional memory semiconductor device.

17. The semiconductor device package of claim 14, further comprising a thermally conductive overmold at least partially covering the logic and memory semiconductor devices and the thermally insulating material.

18. The semiconductor device package of claim 14, wherein a thickness of the thermally insulating material is between about 0.1 mm and about 0.5 mm.

19. The semiconductor device package of claim 14, wherein a height of the thermally insulating material is about 0.05 mm or more.

20. A method of forming a semiconductor device package, comprising:
attaching a second semiconductor device to a first semiconductor device comprising a heat-generating region at an end thereof with at least a portion of the heat-generating region extending laterally beyond an end of the second semiconductor device; and
at least partially covering the end of the second semiconductor device with a thermally insulating material, the thermally insulating material exhibiting a thermal conductivity less than a thermal conductivity of a material adjacent to a portion of the heat-generating region of the first semiconductor device to which the thermally insulating material is not adjacent.

21. The method of claim 20, further comprising providing a material comprising a thermal conductivity of about 0.5 W/m·K or less as the thermally insulating material.

22. The method of claim 20, further comprising attaching an additional semiconductor device to the second semiconductor device on a side thereof opposing a side to which the first semiconductor device is attached with an end of the additional semiconductor device aligned with the end of the second semiconductor device and at least partially covering the aligned end of each additional semiconductor device with the thermally insulating material.

23. The method of claim 22, wherein at least partially covering the end of the second semiconductor device and at least partially covering the aligned end of each additional semiconductor device comprises concurrently covering the end of the second semiconductor device and the aligned end of each additional semiconductor device.

24. The method of claim 20, further comprising at least partially covering the first and second semiconductor devices and the thermally insulating material with a thermally conductive overmold.

25. A method of regulating heat in a semiconductor device package, comprising:
generating heat in a heat-generating region at an end of a first semiconductor device; and
resisting flow of the heat toward a second semiconductor device attached to the first semiconductor device, the end of the first semiconductor device extending laterally beyond an end of the second semiconductor device, utilizing a thermally insulating material at least partially covering the end of the second semiconductor device, the thermally insulating material exhibiting a thermal conductivity less than a thermal conductivity of a material adjacent to a portion of the heat-generating region of the first semiconductor device to which the thermally insulating material is not adjacent.

26. The method of claim 25, wherein resisting flow of the heat utilizing the thermally insulating material comprises resisting flow of the heat utilizing a thermally insulating material comprising a thermal conductivity of 0.5 W/m·K or less.

27. The method of claim 25, wherein resisting flow of the heat utilizing the thermally insulating material comprises maintaining a maximum operational temperature of the second semiconductor device below an operational temperature at which the second semiconductor device would be thermally damaged.

28. The method of claim 27, wherein maintaining the maximum operational temperature of the second semiconductor device below the operational temperature at which the second semiconductor device would be thermally damaged comprises maintaining the maximum operational temperature of the second semiconductor device at about 95° C. or less.

29. The method of claim 25, further comprising resisting flow of the heat toward an additional semiconductor device attached to the second semiconductor device on a side thereof opposing a side to which the first semiconductor device is attached and with an end of the additional semiconductor device at least substantially coplanar with the end of the second semiconductor device, wherein the thermally insulating material at least partially covers the end of the at least one additional semiconductor device.

30. The method of claim 25, wherein resisting flow of the heat toward the second semiconductor device further comprises conducting heat through a thermally conductive overmold at least partially covering the first and second semiconductor devices and the thermally insulating material.

* * * * *

UNITED STATES PATENT AND TRADEMARK OFFICE
CERTIFICATE OF CORRECTION

PATENT NO.         : 8,816,494 B2
APPLICATION NO.    : 13/547296
DATED              : August 26, 2014
INVENTOR(S)        : Steven Groothuis et al.

It is certified that error appears in the above-identified patent and that said Letters Patent is hereby corrected as shown below:

On the title page, item (57), under "Abstract", in column 2, line 9, before "semiconductor" delete "a".

In the claims,

In column 10, line 31, in Claim 2, delete "a the" and insert -- the --, therefor.

Signed and Sealed this
Eleventh Day of November, 2014

Michelle K. Lee
*Deputy Director of the United States Patent and Trademark Office*